(12) United States Patent
Wu et al.

(10) Patent No.: US 12,094,702 B2
(45) Date of Patent: Sep. 17, 2024

(54) SILICON NANOWIRE CHIP AND SILICON NANOWIRE CHIP-BASED MASS SPECTRUM DETECTION METHOD

(71) Applicant: HANGZHOU WELL-HEALTHCARE TECHNOLOGIES CO., LTD., Hangzhou (CN)

(72) Inventors: Jianmin Wu, Hangzhou (CN); Xiaoming Chen, Hangzhou (CN)

(73) Assignee: HANGZHOU WELL-HEALTHCARE TECHNOLOGIES CO., LTD., Hangzhou (CN)

( * ) Notice: Subject to any disclaimer, the term of this patent is extended or adjusted under 35 U.S.C. 154(b) by 443 days.

(21) Appl. No.: 17/621,584

(22) PCT Filed: May 27, 2020

(86) PCT No.: PCT/CN2020/092566
§ 371 (c)(1),
(2) Date: Jan. 4, 2022

(87) PCT Pub. No.: WO2020/259186
PCT Pub. Date: Dec. 30, 2020

(65) Prior Publication Data
US 2022/0359180 A1    Nov. 10, 2022

(30) Foreign Application Priority Data

Jun. 28, 2019 (CN) .......................... 201910579528.1

(51) Int. Cl.
*H01J 49/04* (2006.01)
*G01N 27/623* (2021.01)
*G01N 27/64* (2006.01)

(52) U.S. Cl.
CPC ........ *H01J 49/0418* (2013.01); *G01N 27/623* (2021.01); *G01N 27/64* (2013.01)

(58) Field of Classification Search
CPC .... H01J 49/0418; G01N 27/623; G01N 27/64
See application file for complete search history.

(56) References Cited

U.S. PATENT DOCUMENTS

| 2015/0260710 A1 | 9/2015 | Tseng et al. |
| 2021/0280406 A1 | 9/2021 | Wu et al. |

FOREIGN PATENT DOCUMENTS

| CN | 104630821 A | 5/2015 |
| CN | 104662424 A | 5/2015 |

(Continued)

OTHER PUBLICATIONS

First Search for Chinese Application No. 2019105795281 mailed Aug. 30, 2021.

(Continued)

*Primary Examiner* — Nicole M Ippolito
*Assistant Examiner* — Hanway Chang
(74) *Attorney, Agent, or Firm* — Dorsey & Whitney LLP

(57) ABSTRACT

The present disclosure discloses a silicon nanowire chip and silicon nanowire chip-based mass spectrometry detection method. The detection method includes the following steps: step 1 of manufacturing a silicon nanowire chip, comprising: subjecting a monocrystalline silicon wafer to a surface washing pretreatment, a metal-assisted etching and a post-alkali etching to obtain a silicon nanowire chip with a tip, and performing a surface chemical modification or a nano-material modification on the silicon nanowire chip; step 2 of evaluating mass spectrometry performance of the silicon nanowire chip; and step 3 of performing a tip-contact sampling and in-situ ionization mass spectrometry detection.

15 Claims, 9 Drawing Sheets

(56) References Cited

FOREIGN PATENT DOCUMENTS

| CN | 106841629 A | 6/2017 |
|---|---|---|
| CN | 108987218 A | 12/2018 |
| CN | 109541012 A | 3/2019 |
| CN | 109794237 A | 5/2019 |
| CN | 110203876 A | 9/2019 |
| KR | 20160098653 A | 8/2016 |
| KR | 20170032606 A | 3/2017 |
| KR | 20170135364 A | 12/2017 |

OTHER PUBLICATIONS

International Search Report and Written Opinion from International Application No. PCT/CN2020/092566 mailed Dec. 30, 2020.

Office Action for Chinese Application No. 201910579528.1 mailed Sep. 3, 2021.

Chen, et al., "Tip-Enhanced Photoinduced Electron Transfer and Ionization on Vertical Silicon Nanowires", ACS Applied Materials & Interfaces, 2018, pp. 14389-14398.

Hashim, et al., "Influence of Ag NPs on Silicon Nanocolumns NH3 Gas Sensors", Department of Applied Sciences, University of Technology, Baghdad, Iraq, Nov. 2018, pp. B773-B778.

Leao, et al., "Si Nanowires as Sensors: Choosing the Right Surface", Instituto de Fisica, UniVersidade de Sao Paulo, CP, Feb. 2007, pp. 1172-1177.

Lo Faro, et al., "Silicon Nanowire and Carbon Nanotube Hybrid for Room Temperature Multiwavelength Light Source", Scientific Reports, Nov. 23, 2015, pp. 1-10.

Moulai, et al., "Enhancement of Electrochemical Capacitance of Silicon Nanowires Arrays (SiNWs) by Modification with Manganese Dioxide MnO2", Silicon, Mar. 9, 2019, pp. 2799-2810.

Extended European Search Report for European Application No. 20832586.0 mailed Dec. 17, 2022.

Office Action for Korean Application No. 10-2022-7003459 mailed Sep. 25, 2023.

Bashouti, et al., "Chemical Passivation of Silicon Nanowires with C1—C6 Alkyl Chains through Covalent Si—C Bonds", The Journal of Physical Chemistry C. Letters vol. 112, No. 49, 2008, pp. 19168-19172.

Ellis, et al., "Surface Analysis of Lipds by Mass Spectrometry: More than Just Imaging", Faculty of Science, Medicine and Health—Papers: part A. 1369. https://ro.uow.edu.au/smhpapers/1369, Jan. 1, 2013, 90 pages.

Lu, et al., "Nanomaterials as Assisted Matrix of Laser Desorption/Ionization Time-of-Flight Mass Spectrometry for the Analysis of Small Molecules", Nanomaterials, vol. 7, No. 87. doi:10.3390/nano7040087, Apr. 21, 2017, pp. 1-21.

Picca, et al., "Mechanismas of Nanophase-Induced Desorption in LDI-MS. A Short Review", Nanomaterials vol. 7, No. 75. doi:10.3390/nano7040075, Apr. 2, 2017, pp. 1-20.

precise molecular weight: 201.036

SILICON NANOWIRE CHIP AND SILICON NANOWIRE CHIP-BASED MASS SPECTRUM DETECTION METHOD

CROSS-REFERENCE TO RELATED APPLICATIONS

This application is a U.S. national stage of PCT International Application No. PCT/CN2020/092566, filed on May 27, 2020, and entitled "SILICON NANOWIRE CHIP AND SILICON NANOWIRE CHIP-BASED MASS SPECTRUM DETECTION METHOD", which claims priority to Chinese Patent Application No. 201910579528.1 filed on Jun. 28, 2019.

TECHNICAL FIELD

The present disclosure relates to the technical field of new materials and mass spectrometry detection and analysis methods, and specifically relates to a silicon nanowire chip and a silicon nanowire chip-based mass spectrometry detection method.

BACKGROUND

Collection, pretreatment and detection of a biological sample are three important links in the field of analysis technology. Compared with conventional analysis methods, mass spectrometry analysis has characteristics of high accuracy, high sensitivity, and high content, which is especially suitable for a qualitative and quantitative analysis of a trace analyte in a complex sample and a parallel analysis of multiple analytes, and plays an important role in environmental analysis, food safety, and clinical diagnosis. Among them, a method based on matrix-assisted laser desorption/ionization (MALDI) provides a good platform for the rapid detection of a complex sample due to its characteristics of high speed, high throughput, and strong tolerance to contaminants. However, conventional MALDI mass spectrometry still has two shortcomings: (1) the MALDI detection of all analytes requires the addition of a suitable organic matrix for absorbing laser energy to assist desorption ionization, which is likely to cause serious background interference in the detection of small molecules with a molecular weight of <700 Da; (2) the sample to be tested needs to be spotted onto a MALDI target plate, extraction and transfer processes of the target detection substance is thus still indispensable.

Nanomaterial with special structure and physical properties, especially semiconductor nanomaterial, such as silicon material, metal oxide, metal sulfide, etc., is a good mediator of charge and energy, and can be directly used for surface-assisted laser desorption/ionization mass spectrometry (SALDI-MS) of small molecules, which may not only replace the organic matrix such as CHCA in MALDI and reduce a hot spot effect, but also avoid signal interference of the organic matrix in a low molecular weight region (<800 Da). In Patent document WO 2018126230 A1, a silicon substrate compounded of a variety of nanostructures such as nanopores, nanotubes and nanorods, etc. can be as a material for matrix-free analysis. In patent document WO 2015140243 A1, by loading a layer of indium tin oxide (ITO) on a glass sheet, a variety of molecules in a complex biological sample with a molecular weight up to 30 kDa to 40 kDa including drugs, lipids, metabolites, proteins and the like can be analyzed without a matrix. Although a variety of nanomaterials can solve the problem of background interference, their role is limited to replacing the organic matrix. The sample collection and pretreatment processes required in conventional MALDI are still indispensable.

A solid-phase micro-extraction (SPME) head with nanostructures itself or coated with an inorganic nano-extractant has been widely used in collection and pre-concentration of a sample, and can be combined with analytical detection devices such as GC-MS or LC-MS for identification and characterization of a target molecule. In Patent document CN 103055830 A, a DNA-modified graphene oxide is used as the SPME head to extract antibiotics in the sample for GC-MS detection. In patent document CN 103071473 A, $SiO_2$ gel and carbon nanotubes are coated outside a stainless steel core rod to prepare the SPME head, which can be used in the fields of environment, food, medicine, biology, etc. The simultaneous application of nanomaterials in sampling, extraction, enrichment, and SALDI mass spectrometry detection will inevitably simplify the analysis process of complex samples and increase the feasibility of mass spectrometry in food safety, health management and clinical detection.

A multifunctional chip for sampling and mass spectrometry analysis with being capable of simultaneously enhancing its functions of adsorption, extraction and charge transfer, as well as retaining in-situ information of samples with spatial heterogeneity, is in need in the market, and the present disclosure solves such problems.

SUMMARY

In order to solve the shortcomings of the prior art, the purpose of the present disclosure is to provide a silicon nanowire chip and a silicon nanowire chip-based mass spectrometry detection method. The present disclosure fully utilizes the nanostructure and semiconductor properties of the silicon nanowire chip to integrate a tip-contacting extractive transfer with a matrix-free mass spectrometry detection, thus greatly simplifying collection, pretreatment and detection processes of a complex sample. The manufactured silicon nanowire chip of the present disclosure is capable of simultaneously having functions of adsorption, extraction and mass spectrometry detection, as well as retaining in-situ information of the sample with spatial heterogeneity.

In order to achieve the above objectives, the present disclosure adopts the following technical solutions.

A silicon nanowire chip is manufactured by the following processes:
  step 1 of subjecting a monocrystalline silicon wafer to a surface washing pretreatment, a metal-assisted etching and a post-alkali etching to obtain a silicon nanowire chip with a tip; and
  step 2 of performing a surface chemical modification or a nanomaterial modification on the silicon nanowire chip,
  wherein the surface chemical modification includes: an amino group modification, a carboxyl group modification, and an alkyl chain modification,
  and the nanomaterial modification includes: a metal nanoparticle modification, a metal oxide nanoparticle modification, a metal sulfide nanosheet modification, and a carbon nanomaterial modification.

In the silicon nanowire chip described above, the silicon nanowire chip having metal nanoparticles on surface is manufactured by the following processes:
  step 1 of subjecting a monocrystalline silicon wafer to a surface washing pretreatment, a metal-assisted etching and a post-alkali etching to obtain a silicon nanowire chip with a tip; and step 2 of removing a surface oxide layer of the silicon nanowire chip with the tip by an acid, then coating a layer of a metal salt solution on the surface, and reacting for 10 min to 30 min at room temperature, to obtain the silicon nanowire chip having metal nanoparticles on surface after washing.

In the silicon nanowire chip described above, the silicon nanowire chip having metal oxide nanoparticles on surface is manufactured by the following processes:

step 1 of subjecting a monocrystalline silicon wafer to a surface washing pretreatment, a metal-assisted etching and a post-alkali etching to obtain a silicon nanowire chip with a tip; and step 2 of removing a surface oxide layer on a surface of the silicon nanowire chip obtained by the metal-assisted etching or obtained by the metal-assisted etching and the post-alkali etching, then spin-coating a layer of a metal oxide precursor solution, naturally drying at room temperature, and then performing a high temperature treatment at 450° C. for 2 h, to obtain the silicon nanowire chip with metal oxide nanoparticles on surface.

In the silicon nanowire chip described above, the silicon nanowire chip having carbon nanomaterials on surface is manufactured by the following processes:

step 1 of subjecting a monocrystalline silicon wafer to a surface washing pretreatment, a metal-assisted etching and a post-alkali etching to obtain a silicon nanowire chip with a tip; and step 2 of subjecting the silicon nanowire chip obtained by the metal-assisted etching or obtained by the metal-assisted etching and the post-alkali etching to an oxygen plasma treatment to expose Si—OH on the surface, then reacting it with a toluene solution of siloxane with an end group containing an amino group in a dry environment for 10 min to 120 min, to obtain a silicon nanowire chip with an alkyl chain containing an amino terminal on the surface; and step 3 of electrostatically adsorbing a solution of the carbon nanomaterial on the surface of the silicon nanowire with the amino group on the surface, to obtain the silicon nanowire chip having carbon nanomaterials on surface.

In the silicon nanowire chip described above, wherein the silicon nanowire chip used for sampling of metabolite on a skin surface is manufactured by the following processes:

step 1 of subjecting a monocrystalline silicon wafer to a surface washing pretreatment, a metal-assisted etching and a post-alkali etching to obtain a silicon nanowire chip with a tip; and step 2 of subjecting the silicon nanowire chip obtained by the metal-assisted etching or obtained by the metal-assisted etching and the post-alkali etching to an oxygen plasma treatment to expose Si—OH on the surface, then reacting it with a toluene solution of siloxane with an end group containing an amino group or siloxane without active groups at the end in a dry environment for 10 min to 120 min, to obtain a silicon nanowire chip with an amino group or an alkyl chain on surface.

In the silicon nanowire chip described above, wherein the silicon nanowire chip prepared by the metal-assisted etching has a nanowire length of 0.5 µm to 3 µm and a wire diameter of 50 nm to 200 nm, and the silicon nanowire chip subjected to the post-alkali etching has a length of 0.5 µm to 3 µm, and a wire diameter of 25 nm to 50 nm at top and 50 nm to 100 nm at bottom.

A silicon nanowire chip-based mass spectrometry detection method includes the following steps:

step 1 of manufacturing the silicon nanowire chip, including:

subjecting a monocrystalline silicon wafer to a surface washing pretreatment, a metal-assisted etching and a post-alkali etching to obtain a silicon nanowire chip with a tip; and performing a surface chemical modification or a nanomaterial modification on the silicon nanowire chip, wherein the surface chemical modification including: an amino group modification, a carboxyl group modification, and an alkyl chain modification, and the nanomaterial modification including: a metal nanoparticle modification, a metal oxide nanoparticle modification, a metal sulfide nanosheet modification, and a carbon nanomaterial modification;

step 2 of evaluating a mass spectrometry performance of the silicon nanowire chip, including:

pipetting a standard solution on a surface of the silicon nanowire chip, naturally drying at room temperature, then sticking the silicon nanowire chip on a target plate with a carbon conductive adhesive, and storing in a dry vacuum environment until use for mass spectrometry detection;

wherein the standard solution including: indigo, benzylpyridine, phosphatidylethanolamine, and phosphatidylcholine;

detecting a mass spectrometry signal of the standard solution on the surface of the silicon nanowire in a mass spectrometer under the same energy intensity condition;

comparing ionization efficiencies of multiple silicon nanowire chips after various treatments and modifications;

wherein, under same energy condition, setting a material corresponding to the highest value of intensity of the mass spectrometry signal of indigo and phosphatidylethanolamine as a most suitable silicon nanowire chip for detecting in negative ion mode, and a material corresponding to the highest value of intensity of the mass spectrometry signal of phosphatidylcholine as a most suitable silicon nanowire chip for detecting in positive ion mode; and judging desorption capacity of the material by the assistance of benzylpyridine; and step 3 of performing a tip-contact sampling and in-situ ionization mass spectrometry detection, including:

cleaning or wiping a sample to be sampled, and contacting the silicon nanowire chip with a solid surface to be sampled without distance or immersing the silicon nanowire chip in a liquid, then washing the chip after sampling, naturally drying the chip and completing a contact-sampling process; and fixing the sampled silicon nanowire chip in a frame of the target plate, and inserting it into the mass spectrometer for detection in a corresponding reflection mode.

In the silicon nanowire chip-based mass spectrometry detection method described above, wherein in step 3, the tip-contact sampling and in-situ ionization mass spectrometry detection for detection of body surface sweat includes:

a. immersing the silicon nanowire chip in alcohol overnight, then disinfecting and cutting, and fixing it on an adhesive strip, and storing in a dry and closed environment for later use;

b. wiping a hindneck part of a subject to be tested with a medical alcohol and purified water successively, then sticking the adhesive strip containing the silicon nanowire chip on the hindneck part, and allowing the silicon nanowire chip to contact the skin surface to automatically extract and adsorb sweat molecules secreted on body surface;
c. after sampling, tearing off the silicon nanowire chip from the adhesive strip, washing with deionized water to remove salt or washing with an organic solvent to remove oil molecules, then drying with nitrogen gas, and then storing the chip in a dry and sealed condition; and
d. fixing the silicon nanowire chip in the frame of the target plate and inserting it into the mass spectrometer for detection in negative and positive ion reflection modes, molecular information obtained in negative ion mode being mostly molecules such as fatty acids, and molecular information obtained in positive ion mode being mostly diglycerides and triglycerides.

In the silicon nanowire chip-based mass spectrometry detection method described above, wherein in step 3, the tip-contact sampling and in-situ ionization mass spectrometry detection for fingerprint imaging and detection of exogenous explosive and drug includes:
a. washing and cleaning a finger with clear water, and allowing the finger to naturally secrete oil for 10 min to 30 min;
b. pipetting a droplet of explosive or drug solution onto a clean glass slide, after solvent evaporates, pressing the finger firmly on the surface of the glass slide for 5 s to 10 s;
c. contacting the finger with the surface of the silicon nanowire chip for 10 s to leave a fingerprint imprint, and scanning the silicon nanowire chip with a scanner to obtain an image with dpi>600; and
d. fixing the silicon nanowire chip in the frame of the target plate and inserting it into the mass spectrometer for detection in negative ion reflection mode;
the obtained mass spectrum comprises: information of fatty acid molecules in the fingerprint, and information of the exogenous explosive or drug molecules,
endogenous fatty acids are distributed evenly and it can reflect texture information of the finger, and
the explosive and drug may be identified by multiple characteristic peaks in the mass spectrum.

In the silicon nanowire chip-based mass spectrometry detection method described above, wherein in step 3, the tip-contact sampling and in-situ ionization mass spectrometry detection of pesticide residue on fruit surface includes:
a. uniformly spraying a pesticide standard solution with a concentration of 0.01 ng/cm$^2$~5000 ng/cm$^2$ on an outer skin of the fruit, and allowing solvent to evaporate to obtain a fruit sample;
b. pressing the silicon nanowire chip by hand on the outer peel of the fruit for 5 s to 60 s to complete an in-situ collection process; and
c. fixing the silicon nanowire chip in the frame of the target plate and inserting it into the mass spectrometer for detection in negative ion reflection mode,
the contact sampling process can collect not only pesticide molecular information, but also fatty acid information on the surface of the fruit,
wherein a detection limit of the pesticide on the peel surface is calculated by setting a gradient concentration of pesticide and weighing the quality of the peel, and then compared with an international allowable concentration for pesticide content in food, to judge whether the pesticide residue on the surface of the fruit exceeds a standard.

In the silicon nanowire chip-based mass spectrometry detection method described above, wherein in step 3, the tip-contact sampling and in-situ ionization mass spectrometry detection of pesticide residue in water includes:
a. taking and centrifuging natural water in the water, then collecting a supernatant without particles, and standardly adding a pesticide standard with a concentration of 1 ng/mL~1 mg/mL to the supernatant to obtain a water sample;
b. immersing the silicon nanowire chip in the water sample, and oscillating with a speed of 500 rpm/min to 1000 rpm/min for 10 s to 180 s, then taking the silicon nanowire chip out of the water sample and drying it naturally, to complete a sampling process;
c. fixing the silicon nanowire chip in the frame of the target plate and sending it into the mass spectrometer for detection in negative ion reflection mode, adjusting a sampling time to obtain an extraction kinetic curve, and then controlling the sampling time to calculate a detection limit of the pesticide.

In the silicon nanowire chip-based mass spectrometry detection method described above, wherein in step 3, the tip-contact sampling and in-situ ionization mass spectrometry detection for detection of a tissue sample includes:
a. obtaining a tissue sample from an organ from clinical surgery or animal dissection, and cutting the tissue sample;
b. after cutting the silicon nanowire chip, performing a contact sampling for 5 s to 180 s so as to make the chip touch a tissue surface to allow the tissue to make a deformation of 0.5 mm, to complete the tip-contact sampling;
c. after sampling, thoroughly washing the surface of the chip with pure water and drying naturally, then transferring the chip to a target substrate that matches the mass spectrometer, and placing it in a vacuum dry environment for storage until use for mass spectrometry detection; and
d. inserting the target plate into the mass spectrometer for mass spectrometry detection in negative ion or positive ion reflection mode, to obtain a spectrum of metabolic molecules of the tissue surface within a molecular weight range of 200 Da to 1500 Da.

In the silicon nanowire chip-based mass spectrometry detection method described above, wherein a way for obtaining molecular information at various positions on the tissue surface by contact sampling includes: obtaining by sampling and detecting by using multiple silicon nanowire chips separately, or by contacting various positions on the tissue surface with the same silicon nanowire chip simultaneously and then detecting the spectrum of the metabolic molecules of each position on the chip.

In the silicon nanowire chip-based mass spectrometry detection method described above, wherein if the tissue to be sampled is a kidney tissue, a brain tissue or a lung tissue, the contact sampling time is 30 s; and if the tissue to be sampled is a liver tissue, the contact sampling time is 60 s.

The present disclosure has the following beneficial effects.

According to the contact sampling method with nanomaterials of the present disclosure, analytes can be quickly collected from biological samples in complex environments, especially, the sampling and pretreatment processes are simplified by the multi-dimensional mass spectrometry analysis for human body samples containing a large amount of molecular information such as body fluids and tissues, and the participation of any toxic and harmful organic solvents is avoided.

The silicon nanowire chip of the present disclosure has excellent adsorption and extraction capabilities, the chemical modification on its surface and the combination with metals, metal oxides, and carbon nanomaterials promote its extraction capabilities of certain types of molecules in biological samples, and the use of the silicon nanowire chips can be selected and optimized based on the characteristics of target analytes.

The silicon nanowire chip of the present disclosure can not only be used as a sampling chip which has an extraction ability, but can also be used as a mass spectrometry substrate which has good energy absorption and charge transfer capabilities. For the existing matrix-free substrates on the market, samples are generally pipetted onto the surface of the material, which is not easy to control. While the silicon nanowire chip of the present disclosure can first be used as a sampling chip and then as a mass spectrometry detection chip. In this way, its application range will become wider, and distributed collection and centralized detection may be performed.

The silicon nanowire chip of the present disclosure has good energy and charge accumulation and transfer capabilities. As an indirect band gap semiconductor, the silicon nanowire chip can promote a strong field enhancement and desorption/ionization efficiency for the molecules at its tip under a photoelectric effect of laser, and can suppress the mass spectrometry signals of the substrate material backgrounds, while maintaining the analytes mass spectrometry signals under the premise of controlling the laser energy, so as to achieve a high-throughput mass spectrometry detection and analysis of small molecules without background interference under matrix-free condition.

According to the tip-contact sampling method with the silicon nanowire of the present disclosure, in-situ information can be retained when the chip is in contact with flexible samples such as skin, tissue, etc., so that the distribution of exogenous and endogenous substances in a two-dimensional region can be displayed by mass spectrometry imaging.

The chip and mass spectrometry detection method of the present disclosure has a simple operation and a wide application range, and can be applied to important fields such as food safety, environmental detection, criminal investigation monitoring, health management, and clinical diagnosis.

BRIEF DESCRIPTION OF THE DRAWINGS

FIG. 1 shows scanning electron microscopes of silicon nanowire chips of the present disclosure, wherein FIG. 1A shows a silicon nanowire chip A subjected to a metal-assisted etching only; FIG. 1B shows a silicon nanowire chip B subjected to a post-alkali etching; and FIG. 1C shows a silicon nanowire chip C subjected to a graphene modification.

FIG. 2 shows molecular structure diagrams and representative mass spectra for characterization of desorption/ionization efficiencies of silicon nanowire chips of the present disclosure, wherein, FIGS. 2A-2B represent indigo for characterization of electron transfer capacity, FIGS. 2C-2D represent benzylpyridine for characterization of heat accumulation capacity, FIGS. 2E-2F represent palmitoyl phosphoethanolamine for characterization of desorption ionization efficiency of phospholipid molecules in negative ion mode, and FIGS. 2G-2H represent phosphatidylcholine stearate for characterization of desorption/ionization efficiency of phospholipid molecules in positive ion mode (the abscissa shows the mass-to-charge ratio (m/z), and the ordinate shows the normalized ion intensity in a range of 0 to 1).

FIG. 3 shows mass spectra of sweat secreted by the skin behind the neck of a human body in Experimental Example 1 of the present disclosure, wherein, FIGS. 3A-3B show mass spectra in negative ion and positive ion modes collected from the surface of a silicon nanowire chip after stuck on the human body overnight in a quiet state, and FIGS. 3C-3D show mass spectra in negative ion and positive ion modes collected from a silicon nanowire chip after 30 min exercising (the abscissa shows the mass-to-charge ratio (m/z), and the ordinate shows the ion intensity in the mass spectrometer).

FIG. 9 shows in-situ ionization mass spectra of the pesticide thiabendazole obtained by contact sampling with the silicon nanowire chip on the surface of the orange in Experimental Example 3 of the present disclosure, wherein, FIG. 9A shows a case where the surface of the orange was not cleaned after spraying of thiabendazole, FIG. 9B shows a case where the surface of the orange was cleaned with water after spraying of thiabendazole, and FIG. 9C shows a case where the surface of the orange was cleaned with water and cleaning solution in turn after spraying of thiabendazole (the abscissa shows the mass-to-charge ratio (m/z), and the ordinate shows the ion intensity in the mass spectrometer).

DETAILED DESCRIPTION OF THE EMBODIMENTS

Figure 1:
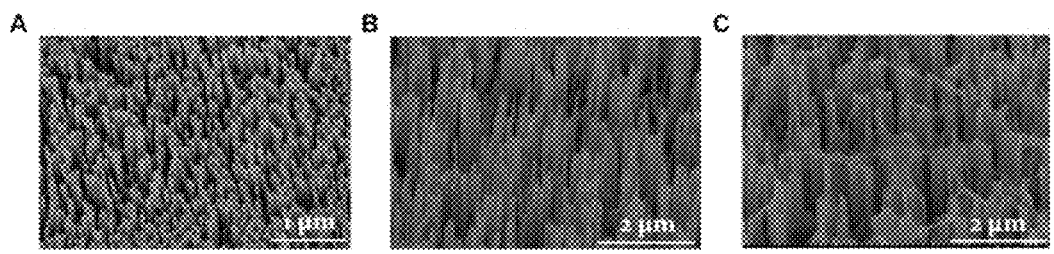

The present disclosure will be described in detail hereinafter in combination with the accompanying drawings and embodiments.

A silicon nanowire chip is manufactured by the following processes.

At step 1, a monocrystalline silicon wafer was subjected to a surface cleaning pretreatment, a metal-assisted etching and a post-alkali etching to obtain a silicon nanowire chip with a tip.

The step of surface cleaning pretreatment of the monocrystalline silicon wafer is specifically as follows: a monocrystalline silicon wafer with p-type or n-type<100> crystal plane was cut into a regular rectangle with a general size of 20 mm×20 mm using laser or a diamond knife in a clean room. The cut monocrystalline silicon wafer was ultrasonically treated with a mixed solution composed of concentrated sulfuric acid and hydrogen peroxide, acetone, ethanol, isopropanol, and deionized water, etc., to remove organic matters and dusts on the surface of the material.

The step of metal-assisted etching of the monocrystalline silicon wafer is specifically as follows: the monocrystalline silicon wafer with a clean surface was immersed in a mixed solution containing silver nitrate and hydrofluoric acid and etched for 5 min to 30 min at room temperature, wherein the concentration of hydrofluoric acid was 4.8 mol/L, and the concentration of silver nitrate was 0.04 mol/L to 0.4 mol/L. After etching, the surface of the silicon wafer was fully washed with deionized water, then immersed in dilute nitric acid for 0.5 h to 12 h to remove the silver on the surface of the silicon wafer, and a hydrophilic, unmodified silicon nanowire chip was finally obtained. The length of nanowire was 0.5 μm to 3 μm and the diameter was 50 nm to 200 nm.

The step of post-alkali etching is specifically as follows: the silicon nanowire chip subjected to metal-assisted etching was immersed in a low-concentration hydrofluoric acid ethanol solution (5%-15%) for 5 min to 30 min, to remove the thin oxide layer on the surface of the silicon nanowire. Si—H group existed on the surface of the silicon nanowire from which the oxide layer had been removed, then the silicon nanowire was allowed to be reacted with a post-etching solution low-concentration potassium hydroxide (0.1%4% mass concentration, the solvent was water:ethanol=9:1) for 30 s to 180 s, and then a silicon nanowire chip with a sharp tip was obtained. The length of the silicon nanowire was 0.5 μm to 3 μm, and its nanowire diameter was 25 nm to 50 nm at top and 50 nm to 100 nm at bottom.

At step 2, the silicon nanowire chip was subjected to a surface chemical modification or a nanomaterial modification.

The surface chemical modification includes: an amino group modification, a carboxyl group modification, and an alkyl chain modification, The step of the surface amino group modification of the silicon nanowire chip was specifically as follows: the silicon nanowire chip obtained by the metal-assisted etching or the silicon nanowire obtained by both the metal-assisted etching and the post-alkali etching was subjected to an oxygen plasma treatment to expose Si—OH on the surface, then reacted with a toluene solution of 3-aminopropyltriethoxysilane in an anhydrous environment for 10 min to 120 min, wherein the volume concentration of 3-aminopropyltriethoxysilane was 1%-5%. After reaction, the resultant was washed sequentially with toluene and ethanol, and cured at 110° C. for 1 h to a obtain a silicon nanowire chip containing alkyl chains with amino terminal on the surface.

The step of the surface carboxyl group modification of the silicon nanowire chip was specifically as follows: the silicon nanowire prepared at step 1 was subjected to low-concentration hydrofluoric acid to remove the surface oxide layer, then carried out a reflux reaction with undecylenic acid or acrylic acid in toluene solution under an oxygen-free and water-free condition for 1 h to 3 h. The volume concentration of undecylenic acid or acrylic acid was 2%-10%. After reaction, the resultant was washed sequentially with toluene and ethanol, to a obtain a silicon nanowire chip containing alkyl chains with carboxyl terminal on the surface.

The step of the surface alkyl chain modification of the silicon nanowire chip was specifically as follows: the silicon nanowire chip obtained by the metal-assisted etching or the silicon nanowire obtained by both the metal-assisted etching and the post-alkali etching at step 1 was subjected to an oxygen plasma treatment to expose Si—OH on the surface, then reacted with a toluene solution containing siloxane with different carbon chain lengths and no active groups at the end in an anhydrous environment for 10 min to 120 min, wherein the volume concentration of the siloxane was 0.1%-5%. After reaction, the resultant was washed sequentially with toluene and ethanol, to a obtain a silicon nanowire chip with alkyl chains of different carbon chain lengths on the surface. The unmodified silicon nanowire with Si—OH on the surface was super-hydrophilic. After being chemically modified on the surface by a siloxane with different carbon chain lengths, its surface hydrophilicity decreased and hydrophobicity increased. For example, it was super-hydrophobic (contact angle>135°) after being modified by an alkyl group containing 18 carbons.

The nanomaterial modification includes: a metal nanoparticle modification, a metal oxide nanoparticle modification, a metal sulfide nanosheet modification, and a carbon nanomaterial modification.

The carbon nanomaterial modification includes: a modification of a variety of carbon nanomaterials such as graphene, graphene oxide, carbon nanotube, and graphene quantum dot.

As an example, the step of the surface metal nanoparticle modification of the silicon nanowire chip was specifically as follows: the silicon nanowire prepared at step 1 was subjected to low-concentration hydrofluoric acid to remove the surface oxide layer, and then the surface was coated with a layer of low-concentration metal salt solution, including a water or ethanol solution of chloroauric acid, silver nitrate, palladium chloride, etc., and reacted at room temperature for 10 min to 30 min. After reaction, the resultant was fully washed with water or ethanol to obtain a silicon nanowire chip with metal nanoparticles on the surface.

As an example, the step of the surface metal oxide nanoparticle modification of the silicon nanowire chip was specifically as follows: the silicon nanowire prepared at step 1 was subjected to low-concentration hydrofluoric acid to remove the surface oxide layer, then surface was spin-coated with a layer of a metal oxide precursor solution, naturally dried at room temperature, and then a high-temperature treatment was performed at 450° C. for 2 h, to obtain a silicon nanowire chip with metal oxide nanoparticles on surface thereof.

As an example, the step of the surface carbon nanomaterial modification of the silicon nanowire chip was specifically as follows: the amino-modified silicon nanowire chip prepared at step 2 was cut into smaller square chips, such as with 5 mm×5 mm. Then a layer of a solution of carbon nanomaterials was added dropwise or evenly spin-coated on the surface. After the solution was dried, the carbon material that was not tightly adsorbed was rinsed off with water, or the silicon nanowire chip was immersed in the solution of carbon nanomaterials, and oscillated at high speed for 5 min to 30 min, so that the carbon nanomaterials with negative charges on the surface were electrostatically adsorbed on the surface of the silicon nanowire with amino groups on its surface. Taking graphene as an example, 2 μL of graphene oxide solution (solvent:water/ethanol=1:1) with a mass fraction concentration of 0.1%4% was added dropwise on the surface of the silicon nanowire chip with 5 mm×5 mm. After it was dried, the silicon nanowire chip was reacted for 0.5 h to 3 h in a hydrazine hydrate atmosphere at 70° C.-90° C. After reaction, the silicon nanowire chip was cooled to room temperature and washed with deionized water to remove the graphene that was not tightly adsorbed, then a silicon nanowire chip containing reduced graphene oxide (i.e., graphene) with different reduction degrees modified on the surface was obtained. The graphene film on the surface of the silicon nanowire chip had a network structure, which would not affect the nanostructure of the silicon nanowire.

The silicon nanowire chip used for sampling of metabolite on a skin or tissue surface was manufactured by the following processes.

At step 1, a monocrystalline silicon wafer was subjected to a surface cleaning pretreatment, a metal-assisted etching and a post-alkali etching to obtain a silicon nanowire chip with a tip.

At step 2, the silicon nanowire chip obtained by the metal-assisted etching or obtained by the metal-assisted etching and the post-alkali etching was subjected to an oxygen plasma treatment to expose Si—OH on the surface, then reacted with a toluene solution of 3-aminopropyltriethoxysilane or octadecyltrichlorosilane in a dry environment for 10 min to 120 min, and then washed and cured at 110° C. for 1 h, to obtain a silicon nanowire chip having an alkyl chain with or without amino group on the surface.

A silicon nanowire chip-based mass spectrometry detection method includes the following steps.

At step 1, the silicon nanowire chip was manufactured.

Wherein a monocrystalline silicon wafer was subjected to a surface cleaning pretreatment, a metal-assisted etching and a post-alkali etching to obtain a silicon nanowire chip with a tip.

Then the silicon nanowire chip was subjected to a surface chemical modification or a nanomaterial modification.

The surface chemical modification includes: an amino group modification, a carboxyl group modification, and an alkyl chain modification, The nanomaterial modification includes: a metal nanoparticle modification, a metal oxide nanoparticle modification, a metal sulfide nanosheet modification, and a modification of carbon nanomaterial such as graphene, graphene oxide, carbon nanotube, and graphene quantum dot.

At step 2, mass spectrometry performance of the silicon nanowire chip was evaluated.

Wherein, a standard solution was added dropwise onto a surface of the silicon nanowire chip of a certain size, and naturally dried at room temperature, then the silicon nanowire chip was stuck on a target plate with a carbon conductive adhesive, and stored in a dry vacuum environment until use for mass spectrometry detection.

The standard solution includes: indigo, benzylpyridine, phosphatidylethanolamine, and phosphatidylcholine.

Mass spectrometry detection of the standard solution on the surface of the silicon nanowire was completed in a mass spectrometer under same energy intensity condition.

Evaluation results: using the silicon nanowire prepared by being subjected to the metal-assisted chemical etching only as a control, among the silicon nanowires that was subjected to the post-alkali etching and modified by nanomaterial, the silicon nanowires that was able to increase the mass spectrum signals of the standard solution to more than twice was the successfully optimized silicon nanowire chip.

The specific steps for the performance evaluation of the in-situ ionization mass spectrometry detection method were as follows.

(1) Indigo, benzylpyridine and target standard analytes were used for mass spectrometry signals acquisition on the surface of silicon nanowires under same energy intensity conditions. The electron transfer capacity (indigo), thermal desorption capacity (benzylpyridine) and difference in sensitivity to target analytes of the silicon nanowires with different structures and different surface modifications were analyzed and compared. Indigo was detected in negative ion mode, and there were four peaks of M−2, M−1, M, and M+1 included in the molecular ion peak, and the benzylpyridine was detected in positive ion mode, and two major peaks of M$^+$ and [M−79]$^+$ were existed in the molecular ion peak. The positive or negative ion mode was selected for the target molecules based on molecule polarity.

(2) Using actual sweat samples and model animal tissue samples as target analytes, their mass spectrum signal intensities and information contents on the surface of silicon nanowires were acquired under the same energy intensity. The overall efficiency of the tip-contact sampling and the in-situ ionization of the silicon nanowires with different structures and different surface modifications were analyzed and compared. The silicon nanowires may be subjected to a high-temperature oxidation treatment to measure the role of electron transfer in the analysis of actual complex samples.

It should be noted that the mass spectrometry detection in steps (1) and (2) were carried out without organic small molecule matrix.

At step 3, tip-contact sampling and in-situ ionization mass spectrometry detection were performed.

Specifically, a sample to be sampled was cleaned or wiped, and the silicon nanowire chip was allowed to directly contact with the solid surface to be sampled or was immersed in a liquid. The chip was washed after sampling, and was naturally dried to complete the contact-sampling process. The sampled silicon nanowire chip was stuck onto the frame of the target plate, and sent into a mass spectrometer for detection in a corresponding reflection mode.

As an example, the step of contact sampling for sweat on the body surface was specifically as follows: a silicon nanowire chip for contact sampling of secreted sweat small molecules was fixed in a small band-aid, and attached to the parts that were easy to secrete sweat, such as hindneck, arms, etc. The parts that need to collect sweat were needed to be wiped cleanly with medical alcohol and deionized water respectively, and then the band-aid with the silicon nanowire chip was stuck smoothly on the skin surface for a period of time. After sampling, the silicon nanowire chip was washed or not washed with deionized water as needed, then dried and used for mass spectrometry detection.

As an example, the step of contact sampling for the explosive and drug remaining on the skin surface was specifically as follows: a finger was washed and cleaned with water and then allow it to naturally secret oil for 10 min to 30 min, and an explosive or a drug in a solution or a powder form was placed on a glass slide. Then, the surface of the solution or powder of explosive or drug was pressed hardly with the finger for 5 s to 10 s, then fingerprints were left by pressing the finger lightly for a short time (about 10 s) on the surface of the silicon nanowire chip, and then sampling was completed.

As an example, the step of contact sampling for pesticides on the surface of fruits and vegetables and in water samples was specifically as follows: a pesticide standard solution of a certain concentration was sprayed on the outer skin of the fruit or vegetable, and after the solvent was evaporated, the silicon nanowire chip was pressed manually or pressed by the driving of a robotic arm on the outer skin of the untreated or washed fruit for 5 s to 60 s, to complete the in-situ collection process. A certain concentration of pesticide standard was standardly added into the natural water taken from a pond or lake, and a silicon nanowire chip of 2 mm×2 mm was immersed in the water sample and oscillated at a certain speed for 10 s to 180 s. The silicon nanowire chip was taken out of the water sample and dried naturally to complete the sampling process.

As an example, the step of contact sampling for lipid metabolites on the tissue surface was specifically as follows: a thawed tissue sample without blood contamination was horizontally placed on a sampling table, the silicon nanowire chip cut into a certain size (for example, 2.5 mm×2.5 mm) was fixed under a programmable robotic arm. After setting of a certain height, moving speed and pressing time, the tip of the silicon nanowire chip was controlled to closely contact the tissue surface for sampling. After sampling, the silicon nanowire chip was taken off and washed fully with deionized water for more than 10 s. After it was dried, it could be used for mass spectrometry detection in positive and negative ion modes.

The performance and factor effect verification experiments for the chips was carried out by using the manufactured silicon nanowire chips that were modified with carbon nanomaterials on surface.

It should be noted that, although only the effect of graphene-compounded silicon nanowire chips was verified in the following, since graphene oxide, carbon nanotubes, and graphene quantum dots, etc., all have the ability to absorb UV light energy and the function of improving charge transfer, the silicon nanowire chips compounded of other carbon nanomaterials also have same performance and effect.

I. Preparation Process of Experimental Materials.

The preparation and graphene modification process of the silicon nanowire chips were as follows.

(1) A washed and cleaned monocrystalline silicon wafer was immersed in a mixed solution containing AgNO$_3$ (0.04 mol/L-0.4 mol/L) and HF (4.8 mol/L) and etched at room temperature for 5 min to 30 min. After the etching was completed, the silicon wafer was fully washed with deionized water, then immersed in dilute nitric acid (with a volume ratio of HNO$_3$ to H$_2$O of 1:1) for 0.5 h to 12 h to remove the silver on the surface of the silicon wafer, then a hydrophilic and unmodified silicon nanowire chip A was obtained.

(2) The silicon nanowire chip A obtained in step (1) was immersed in a low-concentration hydrofluoric acid ethanol solution (5%-15%) for 5 min to 30 min, to remove a thin oxide layer on the surface. The silicon nanowire chip A was allowed to react with a post-etching solution low-concentration potassium hydroxide (0.1%4% mass concentration, the solvent was water:ethanol=9:1) for 30 s to 180 s, and then a silicon nanowire chip B with a sharp tip was obtained.

(3) The silicon nanowire chip B obtained in step (2) was treated by the oxygen plasma to expose the Si—OH on the surface, then reacted with 1%-5% of 3-aminopropyltriethoxysilane (APTES) in toluene solution in a dry and anhydrous environment for 10 min to 120 min. After reaction, the resultant was washed sequentially with toluene and ethanol, and cured at 110° C. for 1 h to a obtain a silicon nanowire chip B containing alkyl chains with amino terminal on the surface.

(4) 2 μL of graphene oxide solution (solvent:water/ethanol=1:1) with a mass fraction concentration of 0.1%4% was added dropwise on the surface of 5 mm×5 mm of silicon nanowire chip B with amino terminal, after it was dried, it was reacted for 0.5 h to 3 h in a hydrazine hydrate atmosphere at 70° C.-90° C. After the reaction was cooled to room temperature, the silicon nanowire chip was washed with deionized water to remove the graphene that was not tightly adsorbed, then a silicon nanowire chip C containing reduced graphene oxide (i.e., graphene) with different reduction degrees modified on the surface was obtained. The graphene film on the surface of the silicon nanowire chip had a network structure. FIG. 1 shows scanning electron micrographs of the silicon nanowire chips A, B, and C.

II. Evaluation of the Mass Spectrometry Performance of the Silicon Nanowire Chips.

Figure 2:
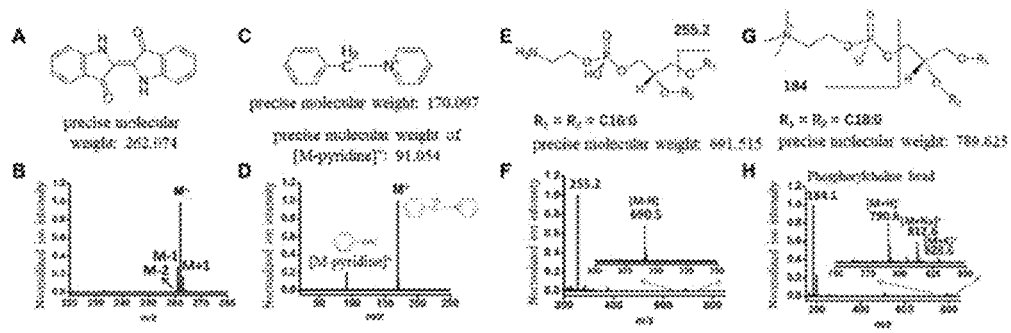

(1) Before conducting the tip-contact sampling and in-situ ionization mass spectrometry detection of actual samples, the mass spectrometry performance of the silicon nanowire chips was needed to be evaluated. Evaluation contents included their charge transfer capacity, desorption efficiency and comprehensive detection capacity for target molecules. Indigo molecule was a good multi-step electron acceptor, which was a model molecule for characterizing the charge transfer capacity. The benzyl pyridinium ion was a commonly-used chemical thermometer for mass spectrometry, whose signal intensity represented the desorption capacity of the material. If it was to detect fatty acids and lipid molecules in sweat or on the surface of tissues, phosphatidylethanolamine and phosphatidylcholine were used as analytical standards. FIG. 2 shows molecular structure diagrams and representative mass spectra on the silicon nanowire chips of the above-mentioned four analytical standards.

(2) Analytical standards were prepared as 0.001 mg/mL to 1 mg/mL solutions using a 50% ethanol solution, as needed. 2 μL to 5 μL was added dropwise onto the surface of the silicon nanowire chip and dried naturally at room temperature. The silicon nanowire chip was stuck on the target plate with a carbon conductive glue and stored in a dry vacuum environment until use for the mass spectrometry detection.

(3) Mass spectrometry signals of the model molecules or analytical standards on the surface of the silicon nanowires were detected in a mass spectrometer under the same energy intensity condition. The electron transfer capacity, heat accumulation capacity and difference in detection sensitivity of target analytes of the silicon nanowires with different structures and different surface modifications were analyzed and compared. Indigo molecule was detected in negative ion mode, and there were our peaks of M−2, M−1, M, and M+1 included in its molecular ion peaks, and the benzylpyridine was detected in positive ion mode, and it mainly existed with two peaks of $M^+$ and $[M-79]^+$. The positive or negative ion mode was selected for the target molecules based on molecular polarity. Phosphatidylethanolamine tended to gain electrons or lose protons, it was thus detected in negative ion mode, and phosphatidylcholine tended to get protons or add alkali metal ions, it was thus detected in positive ion mode.

III. Collection and Detection.

Experimental Example 1: Tip-contact sampling and in-situ ionization mass spectrometry detection for in-situ collection and detection of body surface sweat.

(1) The silicon nanowire chip was immersed in 75% alcohol overnight, sterilized under UV light for more than 12 hours, then cut into smaller square slices (2 mm×2 mm), and then the slices were fixed in a small band-aid and stored in a dry and closed environment for later use.

(2) The hindneck part of a volunteer was wiped with 75% medical alcohol and purified water successively, on which then the band-aid containing the silicon nanowire chip was stuck. The volunteer underwent a moderate-intensity exercise for 30 min to 60 min and a quiet exercise-free sleep for 6 h to 9 h in turn, during which the silicon nanowire chip contacted the skin surface to automatically extract and adsorb the sweat molecules secreted from the body surface.

(3) When the sampling was over, the silicon nanowire chip was torn from the inside of the band-aid dressing and rinsed with deionized water to remove salts such as sodium chloride. If it was necessary to measure water-soluble small molecules such as glucose and to eliminate the interference of a large number of oil molecules, organic solvents may be used for proper washing. Then, the chip was blown dry with nitrogen gas, and stored in a dry and sealed environment.

Figure 3:
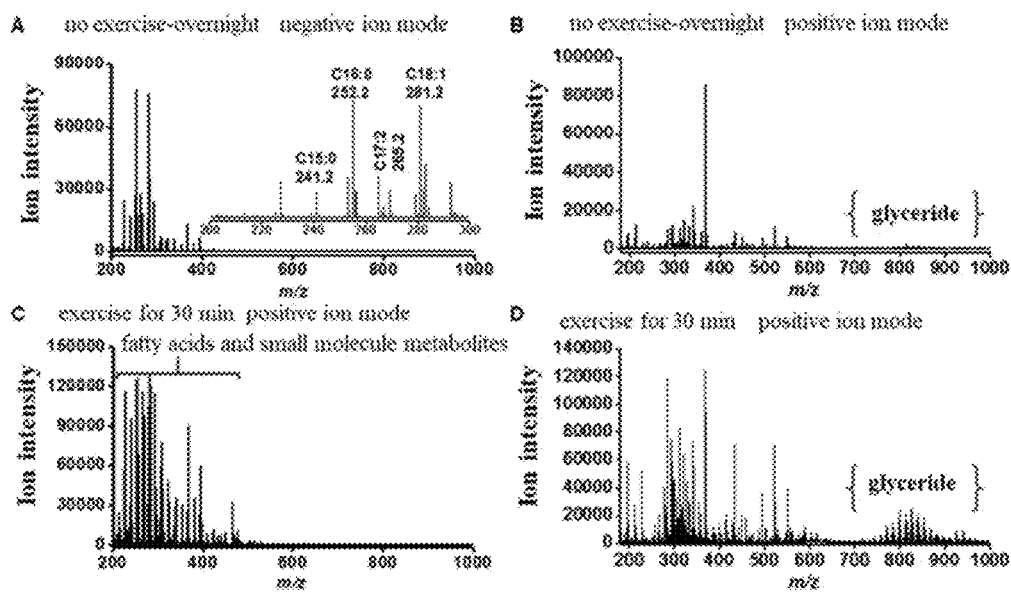
Figure 4:
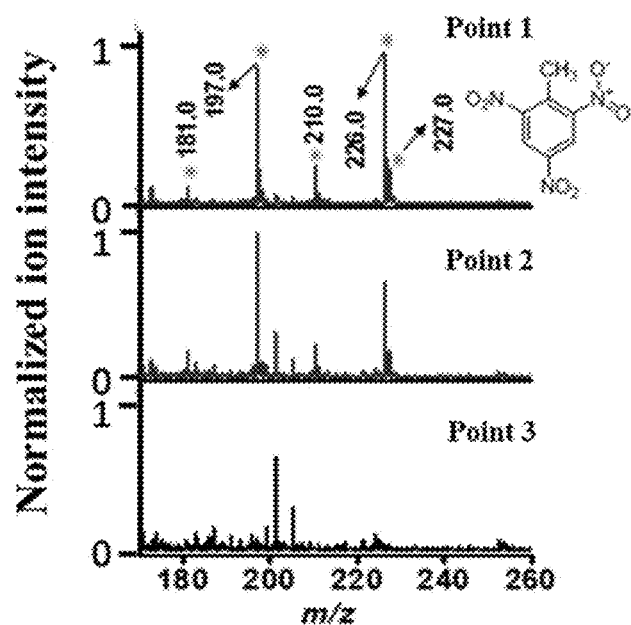
FIG. 4 shows mass spectra of explosive trinitrotoluene in a latent fingerprint in Experimental Example 2 of the present disclosure, wherein the three mass spectra in FIG. 4 correspond to the three points in dashed circles in FIG. 5 (the abscissa shows the mass-to-charge ratio (m/z), and the ordinate shows the normalized ion intensity in a range of 0 to 1).
Figure 5:
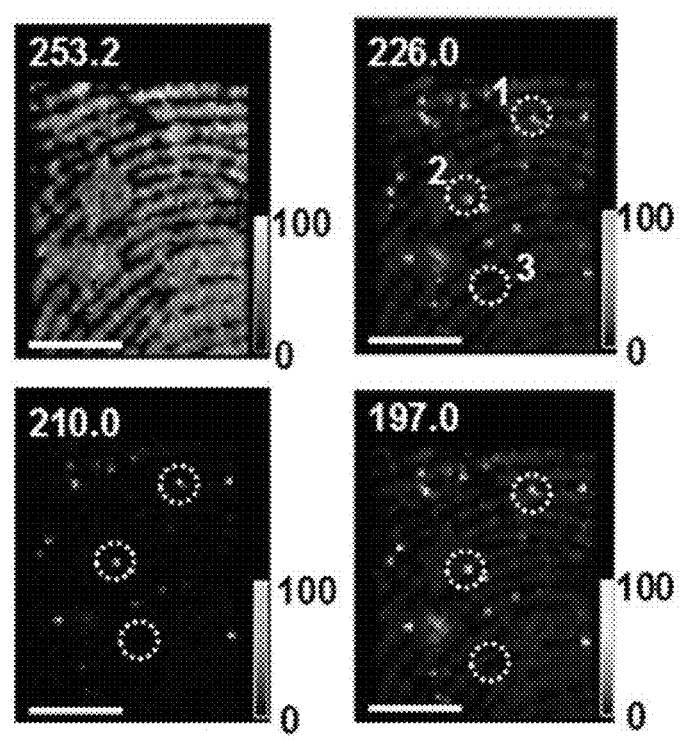
FIG. 5 shows imaging diagrams of the explosive, trinitrotoluene in a latent fingerprint in Experimental Example 2 of the present disclosure.
Figure 6:
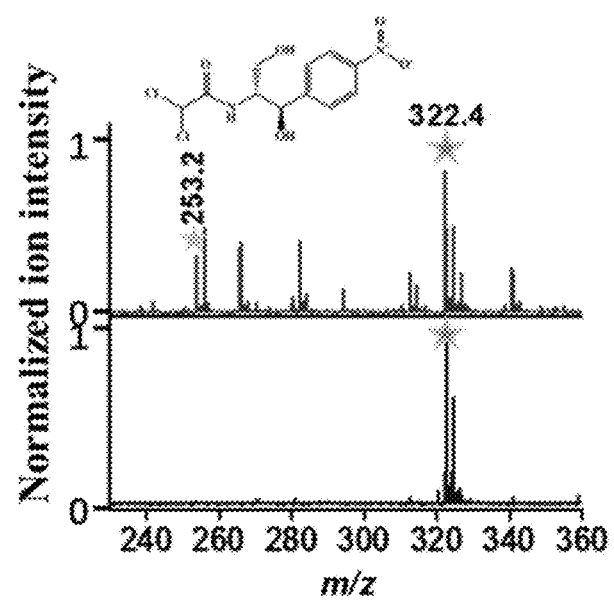
FIG. 6 shows mass spectra of an antibiotic drug chloramphenicol in Experimental Example 2 of the present disclosure, wherein the upper one in FIG. 6 is a mass spectrum of fingerprint after exposure to chloramphenicol, and the lower one is a mass spectrum of pure chloramphenicol (the abscissa shows the mass-to-charge ratio (m/z), and the ordinate shows the normalized ion intensity in a range of 0 to 1).
Figure 7:
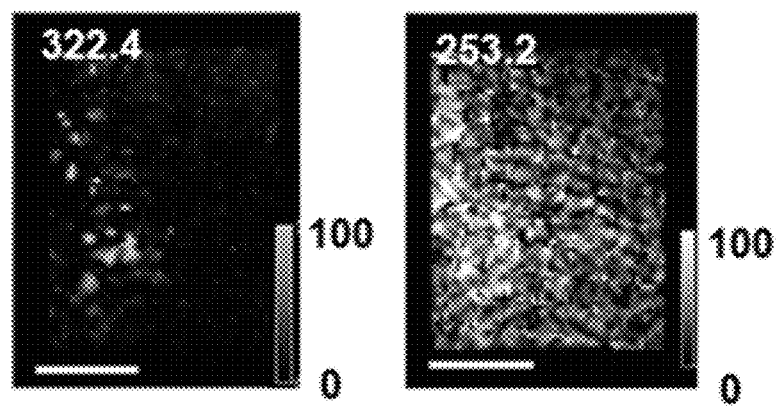
FIG. 7 shows imaging diagrams of the antibiotic drug chloramphenicol in Experimental Example 2 of the present disclosure.

(4) The silicon nanowire chip was stuck onto the frame of the target plate and sent into a mass spectrometer for detection in negative and positive ion reflection modes. The molecular information obtained in negative ion mode was mostly molecules such as fatty acids, and the molecular information obtained in positive ion mode was mostly information of diglycerides and triglycerides, etc. Comparing the quiet state with the exercise state, more metabolic molecules can be produced under the later state obviously, as shown in FIG. 3.

Experimental Example 2: Tip-contact sampling and in-situ ionization mass spectrometry detection for fingerprint imaging and detection of an exogenous explosive and a drug.

(1) A finger was washed and cleaned with clear water, and naturally secreted oil for 10 min to 30 min.

(2) 10 μL-20 μL of 1 mg/mL trinitrotoluene (TNT) in 50% methanol or 0.5 mg/mL chloramphenicol (CAP) in 50% methanol was added dropwise onto a clean glass slide, after the solvent evaporated, the surface of the glass slide where the explosive or drug had been added was pressed firmly by the finger for 5 s to 10 s;

(3) The surface of the silicon nanowire chip was contacted with the finger by pressing for 10 s, then a fingerprint was left, and the front surface of the silicon nanowire chip was scanned with a scanner to obtain an image with dpi>600.

(4) The silicon nanowire chip was stuck onto the frame of the target plate and sent into a mass spectrometer for detection in negative ion reflection mode, and with the help of imaging software, a certain molecular weight range was selected for two-dimensional imaging of the chip surface. As shown in FIGS. 4-7, the obtained mass spectra includes both fatty acid (palmitic acid, C16:0, m/z=253.2) molecules in the fingerprint and exogenous TNT (m/z=227.0) or CAP (m/z=322.4) molecular information. The distribution of endogenous fatty acids was relatively uniform, which could reflect the texture information of the fingers. However, because of the uneven distribution of TNT and CAP when the slide was pressed, there was a certain degree of unevenness when they finally adhered to the surface of the finger. TNT induced fragment due to the presence of photoelectron transfer, thus there were multiple characteristic peaks of m/z=197, 210, 226, etc., which could be used to identify and verify its presence on the surface of the finger.

Experimental Example 3: Tip-contact sampling and in-situ ionization mass spectrometry detection for pesticide residue on a surface of a fruit.

(1) A standard solution of pesticide such as thiabendazole and imazalil with a concentration of 0.01 ng/cm²~5000 ng/cm² was uniformly sprayed on the outer skin of the fruit, after the solvent evaporated, the fruit sample may be: (a) done without any operations; (b) washed with water; or (c) washed with water and detergent in sequence, and etc., and then dried naturally and used for a subsequent sampling process.

Figure 8:
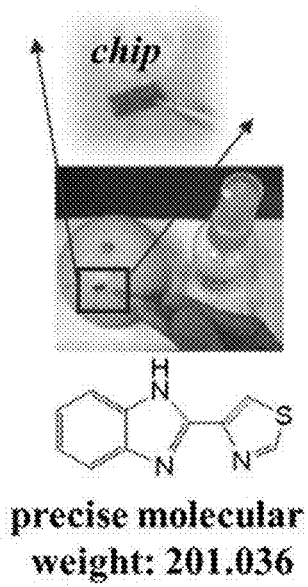
FIG. 8 is a schematic diagram showing contact sampling of pesticide thiabendazole on the surface of an orange with a silicon nanowire chip in Experimental Example 3 of the present disclosure.

(2) The silicon nanowire chip with a size of 2 mm×5 mm was pressed by hand on the outer skin of the fruit for 5 s to 60 s to complete an in-situ collection process, as shown in FIG. 8.

Figure 9:
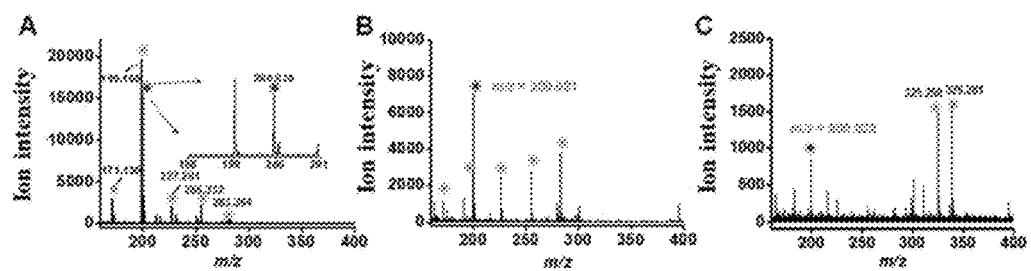

(3) The silicon nanowire chip was stuck onto the frame of the target plate and sent into a mass spectrometer for detection in negative ion reflection mode, the result was as shown in FIG. 9. The contact sampling process can collect both information of pesticide molecules and fatty acid information (m/z=227, 255, 283, etc.) on the surface of the fruit, but the latter did not interfere with the detection of pesticide molecules. The mass spectrum of thiabendazole detected on the unwashed peel surface had the highest intensity, and the signal of thiabendazole detected on the peel surface washed with water and washed with water/detergent successively decreased in sequence, but it still existed. Through setting of the gradient concentration of the pesticide and weighing of the quality of the peel, it could be calculated that the detection limit of the thiabendazole pesticide on the peel surface in this method was 0.1 mg/kg to 0.2 mg/kg, which is lower than the allowable concentration of the pesticide content in international foods (1 mg/kg to 10 mg/kg).

Experimental Example 4: Tip-contact sampling and in-situ ionization mass spectrometry detection for detection of pesticide residue in water.

(1) Natural water from a pond or lake was taken and centrifuged, then a supernatant without particles was collected, and a standard such as thiabendazole and imazalil with a concentration of 1 ng/mL~1 mg/mL was standardly added into the supernatant.

(2) The silicon nanowire chip was cut into a size of 2 mm×2 mm and immersed in the water sample, and oscillated with a speed of 500 rpm/min to 1000 rpm/min for 10 s to 180 s. Then the silicon nanowire chip was taken out of the water sample and dried naturally, then the sampling process was completed.

Figure 10:
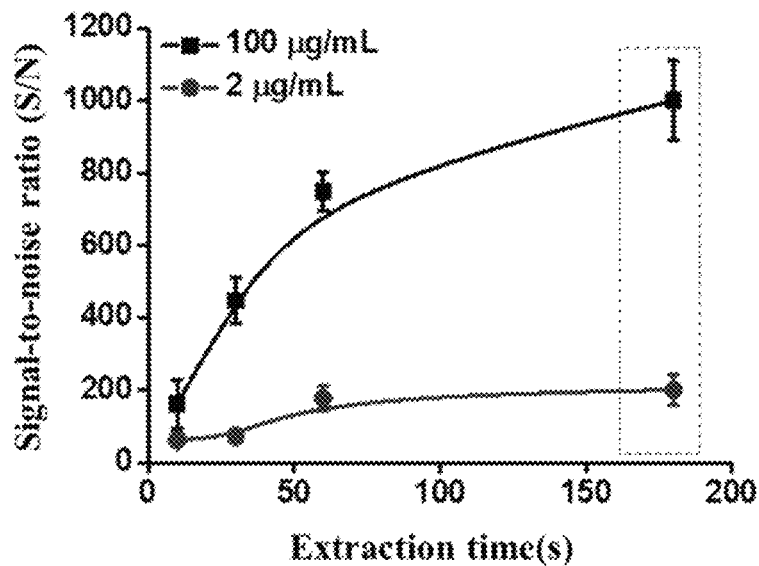
FIG. 10 is a schematic showing the detection kinetic curve of extraction of thiabendazole from a water sample with a silicon nanowire chip in Experimental Example 4 of the present disclosure (the abscissa shows the extraction time, in a unit of second (s); and the ordinate shows the signal-to-noise ratio (S/N)).
Figure 11:
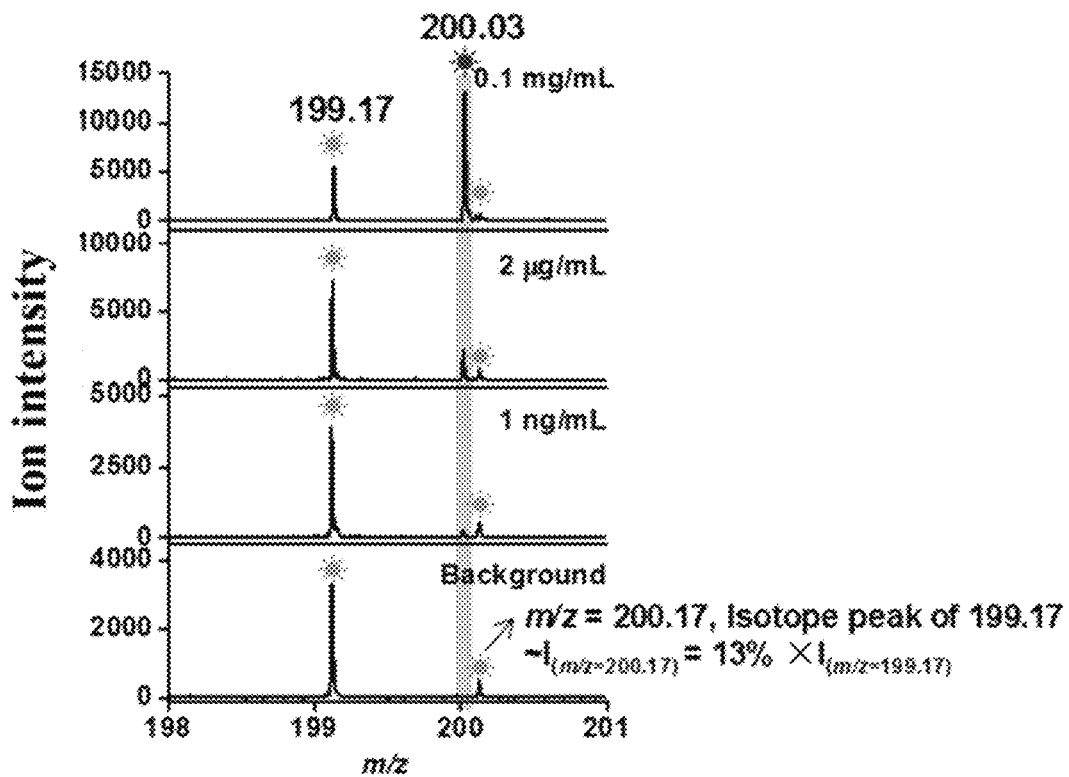
FIG. 11 shows mass spectra of thiabendazole with different concentrations extracted by a silicon nanowire chip in a water sample in Experimental Example 4 of the present disclosure (the abscissa shows the mass-to-charge ratio (m/z), and the ordinate shows the ion intensity in the mass spectrometer).

(3) The silicon nanowire chip was stuck onto the frame of the target plate and sent into the mass spectrometer for detection in negative ion reflection mode, results were as shown in FIGS. 10-11. An extraction kinetic curve could be obtained by adjusting the sampling time. It could be calculated that the detection limit for thiabendazole of this method was less than 1 ng/mL by controlling a certain sampling time.

Experimental Example 5: Tip-contact sampling and in-situ ionization mass spectrometry detection for detection and imaging of metabolites on a tissue surface, and verification of the effect that the silicon nanowire chip can retain in-situ spatial information during the contact sampling process for the tissue.

(1) A thawed kidney tissue sample without blood contamination of a nude mouse was horizontally placed on a sampling table, the silicon nanowire chip that was cut into a size of 2 mm×2 mm or longer, for example, 2 mm×6 mm, was fixed under a programmable robotic arm. After setting a certain height, moving speed and pressing time, the tip of the silicon nanowire chip was controlled to closely contact the tissue surface for sampling. Wherein, a smaller silicon nanowire chip may be used to sample the medulla or cortical region of kidney tissue separately, and a long-striped silicon nanowire chip may be used to sample the cortex and medulla regions of kidney tissue simultaneously.

(2) When the sampling was over, the silicon nanowire chip was removed and washed thoroughly with deionized water to remove salts or co-adsorbed proteins on the surface. After the silicon nanowire chip was dried, it was placed in a vacuum drying environment for storage.

(3) The silicon nanowire chip was stuck onto the frame of the target plate and sent into the mass spectrometer for detection in negative ion reflection mode.

Figure 12:
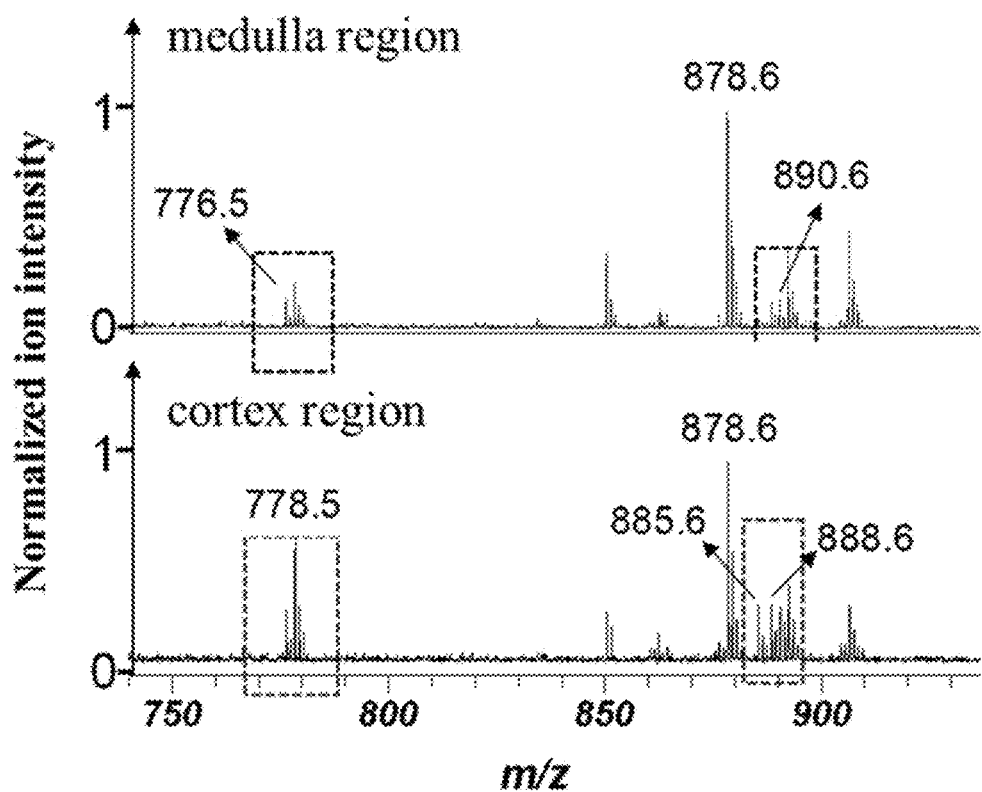
FIG. 12 shows mass spectra of medulla and cortex regions on a surface of a kidney tissue in negative ion mode in Experimental Example 5 of the present disclosure (the abscissa shows the mass-to-charge ratio (m/z), and the ordinate shows the normalized ion intensity in a range of 0 to 1).
Figure 13:
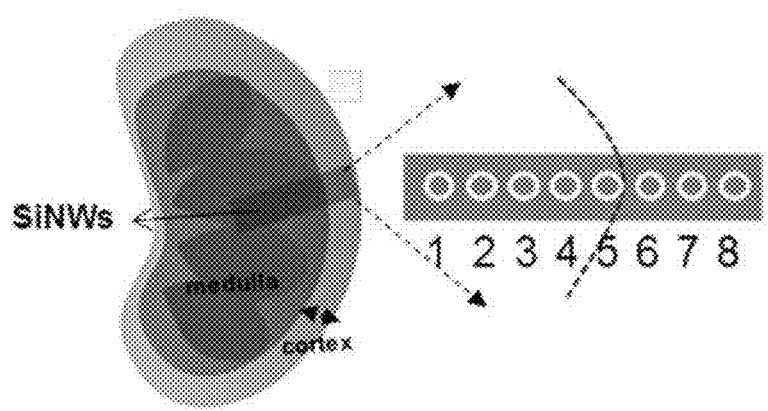
FIG. 13 shows a schematic diagram of multi-point detection of a kidney tissue obtained by contact sampling with a rectangular silicon nanowire chip in Experimental Example 5 of the present disclosure.
Figure 14:
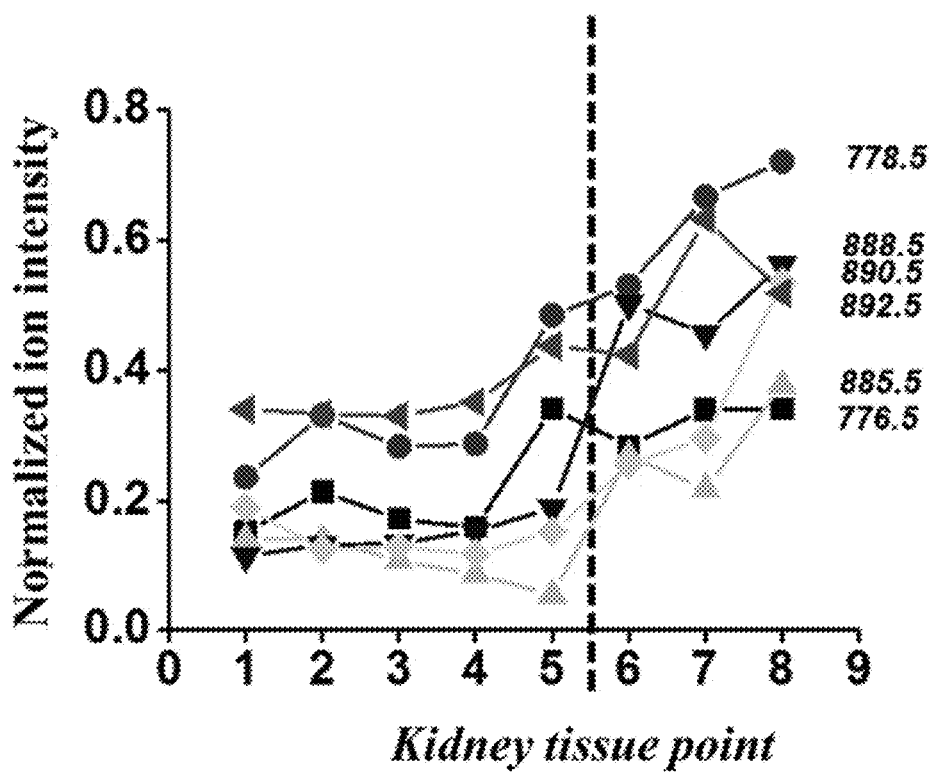
FIG. 14 is a graph showing the change trend of the relative intensity of the characteristic peaks of the mass spectrometry detection of the kidney tissue of nude mice at different points in FIG. 13 in Experimental Example 5 of the present disclosure (the abscissa shows the kidney tissue point, and the ordinate shows the normalized ion intensity in a range of 0 to 1).

The spectra of metabolic molecules in the cortex and medulla regions on the surface of the kidney tissue were shown in FIGS. 12-14.

When the kidney tissue was actively pressed by the silicon nanowire chip to achieve multi-point detection (FIG. 13), the relative intensity of some peaks from the medulla region to the cortex region changed (FIG. 14). The peaks, such as m/z=776.5, 778.5, 885.5, 888.5, 892.5 had higher intensities in the cortex, and lower intensities in the medulla region, which were consistent with the single-point detection results shown in FIG. 12, which reflected that the silicon nanowire chip can retain the in-situ spatial information during the contact sampling process for the tissue.

Experimental Example 6: Optimal experiment of contact sampling time of the tip-contact sampling and in-situ ionization mass spectrometry detection for detection of metabolites on a tissue surface.

(1) Tissue samples of brain, kidney, liver, and lung taken from a nude mouse were taken out of an ultra-low temperature refrigerator at −80° C., thawed at room temperature, and cut appropriately to expose the inner surface.

After the silicon nanowire chip was cut, the chip was allowed to touch the tissue surface to cause a certain deformation in the tissue, the contact sampling time was 5 s to 180 s, then the tip-contact sampling was completed. Preferably, the chip touched the tissue surface to cause a deformation of 0.5 mm in the tissue.

(2) When the sampling was over, the silicon nanowire chip was removed and washed thoroughly with deionized water to remove salts or co-adsorbed proteins on the surface. After the silicon nanowire chip was dried, it was placed in a vacuum drying environment for storage.

(3) The silicon nanowire chip was stuck onto the frame of the target plate and sent into the mass spectrometer for detection in negative ion reflection mode. The ion intensity of the strongest signal peaks in the metabolic molecular spectra of various tissues under different contact sampling times were counted, and the contact sampling time corresponding to the strongest ion intensity was the optimum contact sampling time. Experimental results were shown in Table 1.

TABLE 1

| | tissue | | | |
| --- | --- | --- | --- | --- |
| time | kidney | brain | liver | lung |
| | | ionic strength ± error | | |
| 5 s | 1143 ± 363 | 2208 ± 511 | 258 ± 108 | 1342 ± 398 |
| 10 s | 4409 ± 827 | 15087 ± 4868 | 373 ± 131 | 1211 ± 312 |
| 30 s | 7913 ± 1013 | 26537 ± 5843 | 683 ± 37 | 2135 ± 300 |
| 60 s | 7107 ± 1926 | 6530 ± 688 | 1087 ± 66 | 1755 ± 121 |
| 180 s | 6717 ± 651 | 5660 ± 1199 | 520 ± 90 | 1491 ± 434 |

Result analysis: as shown in Table 1, different contact sampling times will also affect the signal intensities of the resulting mass spectra. The four tissues of brain, kidney, liver, and lung taken from mice were used as examples, if the tissue to be sampled was a kidney tissue, a brain tissue or a lung tissue, then the optimum contact sampling time was 30 s; and if the tissue to be sampled was a liver tissue, then the optimum contact sampling time was 60 s.

Experimental Example 7: Verification of good energy absorption and accumulation and electron transfer capacities for silicon nanowire chips.

The energy absorption and accumulation capacity of the silicon nanowire chip was mainly evaluated by the reflectivity of the chip to UV light, and the electron transfer capacity was mainly evaluated by field emission experiments and the total ion intensity of indigo model molecules by mass spectrometry detection.

Figure 15:
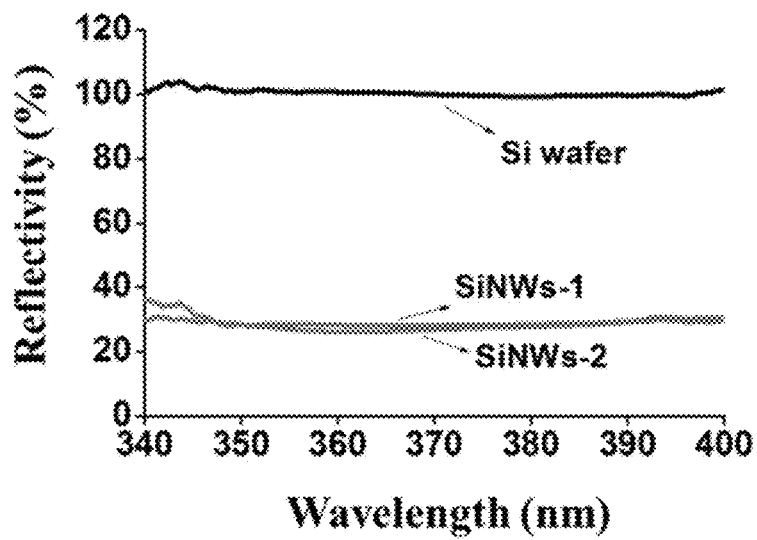
FIG. 15 is a graph showing reflectivity results of silicon nanowire chips and a silicon wafer under UV light radiation in Experimental Example 7 of the present disclosure (the abscissa shows the wavelength, in a unit of nanometer (nm); and the ordinate shows the reflectivity, in a unit of percentage (%)).

(1) The silicon nanowire chip and the silicon wafer were respectively fixed on an integrating sphere device for measuring the reflectivity of a solid surface, and light was irradiated to a sample surface at an incident angle of 8° by an UV light source through an input fiber. The reflected light from the sample was uniformly scattered by the integrating sphere, and signals were collected by a spectrometer. The extinction signal received by the unetched silicon wafer was set to have a reflectivity of 100%, and the reflectivity of the etched silicon nanowire chip was calculated based on the ratio of its extinction signal to the signal of the silicon wafer. FIG. 15 was a graph showing the reflectivity results of a silicon nanowire obtained by the metal-assisted chemical etching (SiNWs-1) and a silicon nanowire obtained by the metal-assisted chemical etching and post-alkali etching (SiNWs-2) in the UV region, when the unetched silicon wafer was set to have 100% reflectivity as a background control, which showed that both had strong UV light energy absorption and accumulation effects, and had a reflectivity less than 30%.

Figure 16:
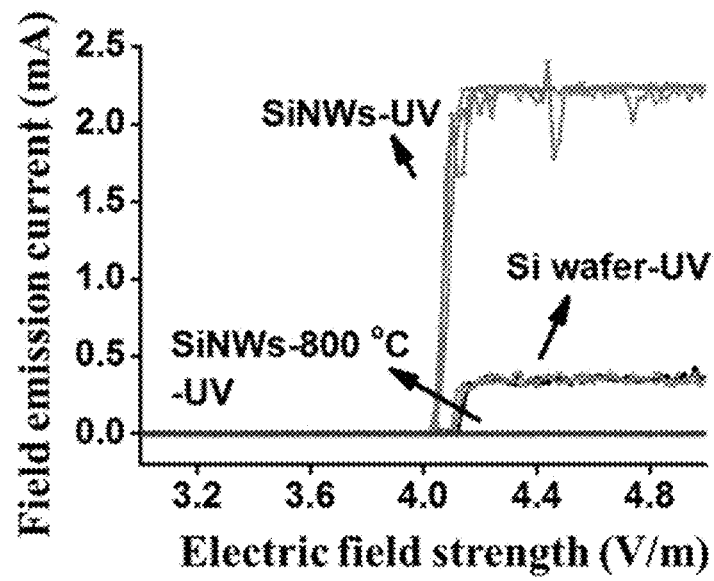
FIG. 16 is a graph showing results of field electron emission of a silicon nanowire chip, a silicon wafer and a high-temperature oxidized silicon nanowire chip under assistance of UV light in Experimental Example 7 of the present disclosure (the abscissa shows the electric field intensity, in a unit of volts/meter (V/m)); and the ordinate shows the field emission current, in a unit of milliampere (mA)).

(2) The silicon nanowire chip was used as a negative electrode, and an ITO glass was used as a positive electrode, and they were fixed in a chamber of polytetrafluoroethylene. The chip etched with a nanowire array was opposite to the front of the ITO, and the middle edge was separated by a black tape with a thickness of 100 μm. An UV light source was fixed on the top of the ITO glass and could directly irradiate the surface of the silicon nanowire chip. A vacuum pump was connected to the chamber to maintain a vacuum environment. A bias voltage from 0 V to 500 V was applied between the two electrodes to scan, and the current value was measured in real time with a picoammeter and recorded in real time. In order to prove the influence of the semiconductor property of a material on the electron emission capacity of the silicon nanowire, the silicon nanowire subjected to a heat treatment at 800° C. for 20 min and the unetched silicon wafer were also used for field emission. FIG. 16 is a graph showing the results of the field emission, which showed that under the same electric field environment, the silicon nanowire had a strong electron emission capacity under the conditions of UV light and external electric field, which was significantly higher than that of the silicon wafer by more than 5 times. However, the silicon nanowire subjected to the high-temperature oxidation treatment was unable to emit electrons since it lost semiconductor properties.

Figure 17:
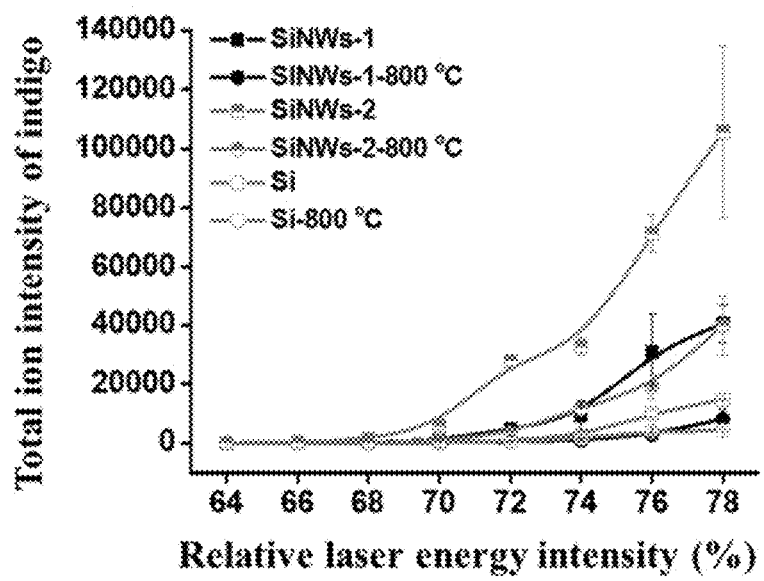
FIG. 17 is a graph showing comparison results of the total ion intensity of indigo molecules under different relative laser energy intensities for silicon nanowire chips, silicon wafers, and high-temperature oxidized silicon nanowire chips in Experimental Example 7 of the present disclosure (the abscissa shows the relative laser energy intensity, in a unit of percentage (%); and the ordinate shows the ion intensity of indigo molecule in the mass spectrometer).

(3) The mass spectrum signals of indigo molecules on the silicon nanowire chip, the silicon wafer, and the silicon nanowire chips subjected to the high-temperature oxidation in negative ion mode were measured and their total ion intensity were calculated. The total ion intensity of indigo molecules could be used to evaluate the electron transfer capacity of the material substrate. As shown in FIG. 17, for silicon materials with the same electrical conductivity, the ion intensity detected on the silicon nanowires with nanostructures was much higher than the total ion intensity on the unetched silicon wafers. At the same time, the silicon nanowire chips that were subjected to the post-alkali etching showed higher model molecular signals and lower energy thresholds than the silicon nanowire chips that were not subjected to the post-alkali etching. under any relative laser energy intensity, the ratio of the total ion intensity of the indigo molecules of the two was more than 2, indicating that the nanowire with the tip could promote the electron transfer process. While the intensity of the ion signal of indigo on the material substrate subjected to the thermal oxidation treatment was greatly reduced, reflecting the hindrance of the electron transfer process.

Figure 18:
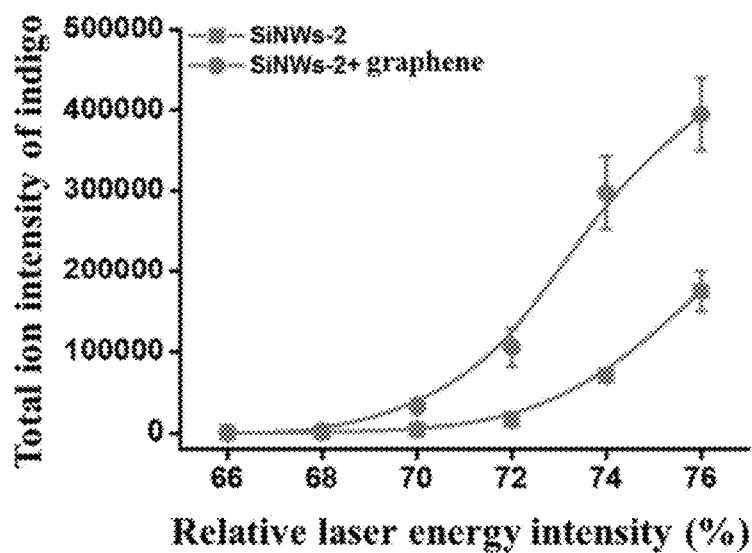
FIG. 18 is a graph showing comparison results of the total ion intensity of indigo molecules under different relative laser energy intensities for a silicon nanowire chip, and a silicon nanowire chip compounded with graphene in Experimental Example 7 of the present disclosure (the abscissa shows the relative laser energy intensity, in a unit of percentage (%); and the ordinate shows the ion intensity of indigo molecule in the mass spectrometer).

(4) The mass spectrum signals of indigo molecules on the silicon nanowire chip, and the silicon nanowire chip compounded with graphene on the surface in negative ion mode were measured and their total ion intensity were calculated. As shown in FIG. 18, the composite chip was able to obtain a total ion intensity of indigo molecule higher than 2 times of the silicon nanowire chip under any relative laser energy intensity condition, indicating that the silicon nanowire-nanocarbon composite chip had more excellent electron transfer capacity.

According to the above-mentioned Experimental Examples, it can be shown that the silicon nanowire chip of the present disclosure can not only be used as a sampling chip having an extraction function, but can also be used as a mass spectrometry substrate with good energy absorption and charge transfer abilities. For the simple matrix-free substrates on the market, samples solutions are generally pipetted onto the surface of the material, which is not easy to control. However, the silicon nanowire chip of the present disclosure can first be used as a sampling chip and then as a mass spectrometry detection chip. In this way, its application range will become wider, and distributed collection and centralized detection may be performed.

The basic principles, main features and advantages of the present disclosure have been shown and described above. Those skilled in the art should understand that the foregoing embodiments do not limit the present disclosure in any form, and technical solutions obtained by means of equivalent substitutions or equivalent transformations shall all fall within the protection scope of the present disclosure.

What is claimed is:

1. A process for manufacturing a silicon nanowire chip, the process comprising:
   step 1 of subjecting a monocrystalline silicon wafer to a surface washing pretreatment, a metal-assisted etching and a post-alkali etching to obtain a silicon nanowire chip with a tip; and
   step 2 of performing a surface chemical modification or a nanomaterial modification on the silicon nanowire chip,
   wherein the surface chemical modification comprises: an amino group modification, a carboxyl group modification, and an alkyl chain modification,
   wherein the nanomaterial modification comprises: a metal nanoparticle modification, a metal oxide nanoparticle modification, a metal sulfide nanosheet modification, and a carbon nanomaterial modification.

2. The process according to claim 1, wherein the process for manufacturing the silicon nanowire chip having metal nanoparticles on surface comprises:
   step 1 of subjecting a monocrystalline silicon wafer to a surface washing pretreatment, a metal-assisted etching and a post-alkali etching to obtain a silicon nanowire chip with a tip; and
   step 2 of removing a surface oxide layer of the silicon nanowire chip with the tip by an acid, then coating a layer of a metal salt solution on the surface, and reacting for 10 min to 30 min at room temperature, to obtain the silicon nanowire chip having metal nanoparticles on surface after washing.

3. The process according to claim 1, wherein the process for manufacturing the silicon nanowire chip having metal oxide nanoparticles on surface comprises:

step 1 of subjecting a monocrystalline silicon wafer to a surface washing pretreatment, a metal-assisted etching and a post-alkali etching to obtain a silicon nanowire chip with a tip; and step 2 of removing a surface oxide layer on a surface of the silicon nanowire chip obtained by the metal-assisted etching or obtained by the metal-assisted etching and the post-alkali etching, then spin-coating a layer of a metal oxide precursor solution, naturally drying at room temperature, and then performing a high temperature treatment at 450° C. for 2 h, to obtain the silicon nanowire chip having metal oxide nanoparticles on surface.

4. The process according to claim 1, wherein the process for manufacturing the silicon nanowire chip having carbon nanomaterials on surface comprises:

step 1 of subjecting a monocrystalline silicon wafer to a surface washing pretreatment, a metal-assisted etching and a post-alkali etching to obtain a silicon nanowire chip with a tip; and step 2 of subjecting the silicon nanowire chip obtained by the metal-assisted etching or obtained by the metal-assisted etching and the post-alkali etching to an oxygen plasma treatment to expose Si—OH on the surface, then reacting it with a toluene solution of siloxane with an end group containing an amino group in a dry environment for 10 min to 120 min, to obtain a silicon nanowire chip with an alkyl chain containing an amino terminal on the surface; and step 3 of electrostatically adsorbing a solution of the carbon nanomaterial on the surface of the silicon nanowire with the amino group on the surface, to obtain the silicon nanowire chip having carbon nanomaterials on surface.

5. The process according to claim 1, wherein the process for manufacturing the silicon nanowire chip used for sampling of metabolite on a skin surface comprises:

step 1 of subjecting a monocrystalline silicon wafer to a surface washing pretreatment, a metal-assisted etching and a post-alkali etching to obtain a silicon nanowire chip with a tip; and step 2 of subjecting the silicon nanowire chip obtained by the metal-assisted etching or obtained by the metal-assisted etching and the post-alkali etching to an oxygen plasma treatment to expose Si—OH on the surface, then reacting it with a toluene solution of siloxane with an end group containing an amino group or siloxane without active groups at the end in a dry environment for 10 min to 120 min, to obtain a silicon nanowire chip with an amino group or an alkyl chain on surface.

6. The process according to claim 1, wherein the silicon nanowire chip prepared by the metal-assisted etching has a nanowire length of 0.5 μm to 3 μm and a wire diameter of 50 nm to 200 nm, and the silicon nanowire chip subjected to the post-alkali etching has a nanowire length of 0.5 μm to 3 μm, and a wire diameter of 25 nm to 50 nm at top and 50 nm to 100 nm at bottom.

7. A silicon nanowire chip manufactured by the process of claim 1.

8. A silicon nanowire chip-based mass spectrometry detection method, comprising:

step 1 of manufacturing the silicon nanowire chip, comprising:

subjecting a monocrystalline silicon wafer to a surface washing pretreatment, a metal-assisted etching and a post-alkali etching to obtain a silicon nanowire chip with a tip; and performing a surface chemical modification or a nanomaterial modification on the silicon nanowire chip, wherein the surface chemical modification comprising: an amino group modification, a carboxyl group modification, and an alkyl chain modification, wherein the nanomaterial modification comprising: a metal nanoparticle modification, a metal oxide nanoparticle modification, a metal sulfide nanosheet modification, and a carbon nanomaterial modification;

step 2 of evaluating mass spectrometry performance of the silicon nanowire chip, comprising:

pipetting a standard solution on a surface of the silicon nanowire chip manufactured, naturally drying at room temperature, then sticking the silicon nanowire chip on a target plate with a carbon conductive adhesive, and storing in a dry vacuum environment until use for a mass spectrometry detection, wherein the standard solution comprising: indigo, benzylpyridine, phosphatidylethanolamine, and phosphatidylcholine;

detecting mass spectrometry signals of the standard solution on the surface of the silicon nanowire chip in a mass spectrometer under same energy intensity condition;

comparing ionization efficiencies of multiple silicon nanowire chips subjected to various treatments and modifications;

wherein, under the same energy condition, setting a material corresponding to the highest value of intensity of the mass spectrometry signal of indigo and phosphatidylethanolamine as a most suitable silicon nanowire chip for detecting in negative ion mode, and a material corresponding to the highest value of intensity of the mass spectrometry signal of phosphatidylcholine as a most suitable silicon nanowire chip for detecting in positive ion mode; and judging desorption capacity of the material by the assistance of benzylpyridine; and step 3 of performing a tip-contact sampling and in-situ ionization mass spectrometry detection, comprising:

cleaning or wiping a sample to be sampled, and contacting the silicon nanowire chip with a solid surface to be sampled without distance or immersing the silicon nanowire chip in a liquid, then washing the chip after sampling, and naturally drying the chip to complete a contact sampling process; and fixing the sampled silicon nanowire chip in a frame of the target plate, and sending it into the mass spectrometer for detection in a corresponding reflection mode.

9. The silicon nanowire chip-based mass spectrometry detection method according to claim 8, wherein in step 3, the tip-contact sampling and in-situ ionization mass spectrometry detection of body surface sweat comprises:

a. immersing the silicon nanowire chip in alcohol overnight, then disinfecting and cutting, and fixing it on an adhesive strip, and storing in a dry and closed environment for later use;

b. wiping a hindneck part of a subject to be tested with a medical alcohol and purified water successively, then sticking the adhesive strip containing the silicon nanowire chip on the hindneck part, and allowing the silicon nanowire chip to contact the skin surface to automatically extract and adsorb sweat molecules secreted on body surface;

c. after sampling, tearing off the silicon nanowire chip from the adhesive strip, washing with deionized water to remove salts or washing with an organic solvent to remove oil molecules, then drying with nitrogen gas, and then storing the chip in a dry and sealed condition; and d. fixing the silicon nanowire chip in the frame of the target plate and sending it into the mass spectrometer for detection in negative and positive ion reflection modes, to obtain information of metabolic molecules.

10. The silicon nanowire chip-based mass spectrometry detection method according to claim 8, wherein in step 3, the tip-contact sampling and in-situ ionization mass spectrometry detection for fingerprint imaging and detection of exogenous explosive and drug comprises:

a. washing and cleaning a finger with clear water, and allowing the finger to naturally secrete oil for 10 min to 30 min;

b. pipetting a solution of explosive or drug onto a clean glass slide, after solvent evaporates, pressing the finger firmly on a surface of the glass slide where the explosive or drug has been added dropwise for 5 s to 10 s;

c. contacting the finger with the surface of the silicon nanowire chip for 10 s to leave a fingerprint imprint, and scanning the silicon nanowire chip with a scanner to obtain an image with dpi>600; and d. fixing the silicon nanowire chip in the frame of the target plate and sending it into the mass spectrometer for detection in negative ion reflection mode;

wherein, the obtained mass spectrum comprises: information of fatty acid molecules in the fingerprint, and information of the exogenous explosive or drug molecules, endogenous fatty acids are distributed evenly and they can reflect texture information of the finger, and the explosive and drug are identified by multiple characteristic peaks in the mass spectrum.

11. The silicon nanowire chip-based mass spectrometry detection method according to claim 8, wherein in step 3, the tip-contact sampling and in-situ ionization mass spectrometry detection of pesticide residue on fruit surface comprises:

a. uniformly spraying a pesticide standard solution with a concentration of 0.01 ng/cm$^2$~5000 ng/cm$^2$ on an outer skin of the fruit, and allowing solvent to evaporate to obtain a fruit sample;

b. pressing the silicon nanowire chip by hand on the outer skin of the fruit for 5 s to 60 s to complete an in-situ collection process; and c. fixing the silicon nanowire chip in the frame of the target plate and sending it into the mass spectrometer for detection in negative ion reflection mode, wherein, the contact sampling process collects not only pesticide molecular information, but also fatty acid information on the surface of the fruit, a detection limit of the pesticide on the peel surface is calculated by setting a gradient concentration of pesticide and weighing the quality of the peel, and then compared with an international allowable concentration for pesticide content in foods, to judge whether the pesticide residue on the surface of the fruit exceeds a standard.

12. The silicon nanowire chip-based mass spectrometry detection method according to claim 8, wherein in step 3, the tip-contact sampling and in-situ ionization mass spectrometry detection for detection of pesticide residue in water comprises:

a. taking and centrifuging natural water in the water, then collecting a supernatant without particles, and standardly adding a pesticide standard with a concentration of 1 ng/ml~1 mg/mL into the supernatant to obtain a water sample;

b. immersing the silicon nanowire chip in the water sample, and oscillating with a speed of 500 rpm/min to 1000 rpm/min for 10 s to 180 s, then taking the silicon nanowire chip out of the water sample and drying it naturally, to complete a sampling process;

c. fixing the silicon nanowire chip in the frame of the target plate and sending it into the mass spectrometer for detection in negative ion reflection mode, adjusting a sampling time to obtain an extraction kinetic curve, and then controlling the sampling time to calculate a detection limit of the pesticide.

13. The silicon nanowire chip-based mass spectrometry detection method according to claim 8, wherein in step 3, the tip-contact sampling and in-situ ionization mass spectrometry detection for detection of a tissue sample comprises:

a. obtaining a tissue sample from an organ from clinical surgery or animal dissection, and cutting the tissue sample;

b. after cutting the silicon nanowire chip, performing a contact sampling for 5 s to 180 s so as to make the chip touch the tissue surface to allow the tissue to have a deformation of 0.5 mm, to complete a tip-contact sampling;

c. after sampling, thoroughly washing the surface of the chip with pure water and drying naturally, then transferring the chip onto a target substrate that matches the mass spectrometer, and placing it in a vacuum dry environment for storage until use for mass spectrometry detection; and d. sending the target plate into the mass spectrometer for mass spectrometry detection in negative ion or positive ion reflection mode, to obtain a spectrum of metabolic molecules of the tissue surface within a molecular weight range of 200 Da to 1500 Da.

14. The silicon nanowire chip-based mass spectrometry detection method according to claim 13, wherein a way for obtaining molecular information at various positions on the tissue surface by contact sampling comprises: obtaining by sampling and detecting by using multiple silicon nanowire chips separately, or by contacting various positions on the tissue surface with a same silicon nanowire chip simultaneously and then detecting the spectrum of the metabolic molecules at each position on the chip.

15. The silicon nanowire chip-based mass spectrometry detection method according to claim 13, wherein if the tissue to be sampled is a kidney tissue, a brain tissue or a lung tissue, the contact sampling time is 30 s; and if the tissue to be sampled is a liver tissue, the contact sampling time is 60 s.

* * * * *